United States Patent
Park et al.

(10) Patent No.: US 8,120,058 B2
(45) Date of Patent: Feb. 21, 2012

(54) HIGH-DRIVE CURRENT MOSFET

(75) Inventors: Jae-Eun Park, Hopewell Junction, NY (US); Xinlin Wang, Hopewell Junction, NY (US); Xiangdong Chen, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/607,116

(22) Filed: Oct. 28, 2009

(65) Prior Publication Data

US 2011/0095333 A1     Apr. 28, 2011

(51) Int. Cl.
*H01L 29/739* (2006.01)

(52) U.S. Cl. ........ 257/139; 257/336; 257/378; 257/379; 257/655; 257/370; 257/371; 257/E29.197; 257/E21.382; 438/135

(58) Field of Classification Search ................... 257/336, 257/139, 378, 370, 371, 379, 655, E29.197, 257/E21.382; 438/135
See application file for complete search history.

(56) References Cited

U.S. PATENT DOCUMENTS

| | | | |
|---|---|---|---|
| 4,769,686 A * | 9/1988 | Horiuchi et al. | 257/373 |
| 5,247,200 A * | 9/1993 | Momose et al. | 257/378 |
| 6,404,012 B1 * | 6/2002 | Takahashi | 257/343 |
| 2003/0001206 A1 * | 1/2003 | Negoro et al. | 257/336 |
| 2004/0145027 A1 | 7/2004 | Nitta et al. | |
| 2008/0296624 A1 | 12/2008 | Murayama et al. | |
| 2009/0114950 A1 | 5/2009 | Agarwal et al. | |
| 2009/0242996 A1 * | 10/2009 | van Bentum et al. | 257/369 |

OTHER PUBLICATIONS

International Search Report/Written Opinion, Jun. 15, 2011.

* cited by examiner

*Primary Examiner* — Marc Armand
(74) *Attorney, Agent, or Firm* — Scully, Scott, Murphy & Presser, P.C.; H. Daniel Schnurmann (57) ABSTRACT

A method of forming a semiconductor device having an asymmetrical source and drain. In one embodiment, the method includes forming a gate structure on a first portion of the substrate having a well of a first conductivity. A source region of a second conductivity and drain region of the second conductivity is formed within the well of the first conductivity in a portion of the substrate that is adjacent to the first portion of the substrate on which the gate structure is present. A doped region of a second conductivity is formed within the drain region to provide an integrated bipolar transistor on a drain side of the semiconductor device, in which a collector is provided by the well of the first conductivity, the base is provided by the drain region of the second conductivity and the emitter is provided by the doped region of the second conductivity that is present in the drain region. A semiconductor device formed by the above-described method is also provided.

20 Claims, 3 Drawing Sheets

HIGH-DRIVE CURRENT MOSFET

BACKGROUND

The present disclosure relates generally to semiconductor devices, and more particularly to drive current modifications in semiconductor devices.

For decades, chip manufacturers have made semiconductor devices faster by making them smaller. Further, there are many techniques to improve mobility of the charge carriers of the semiconductor devices. The stress-line engineering is one aspect that can affect the ability of semiconductor devices to generate a high channel current. In some instances, the drive current or channel current may be increased by increasing device scaling or by decreasing the channel dopant. Additionally, the gate dielectric layer may be thinned and the dielectric constant of the gate dielectric layer may be increased. Reducing channel doping to increase the drain current typically results in a high stand-by leakage current that is not adequate for power management. Further, thinning of the gate dielectric layer and the incorporation of high-k dielectrics increases process complexity and cost.

SUMMARY

A semiconductor device is provided that in one embodiment includes a bipolar transistor that is integrated with the drain region of the semiconductor device along with the substrate. In one embodiment, the semiconductor device includes a gate structure present atop a channel portion of a substrate having a first conductivity. A source region of a second conductivity is present at a first end of the channel portion of the substrate. A drain region of the second conductivity which is different from the first conductivity is present at a second end of the channel portion of the substrate. The drain region further comprises a doped region of a first conductivity, in which the doped region of the first conductivity is separated from the channel region by a remaining portion of the drain region that is of the second conductivity. The bipolar transistor that is integrated with the drain region of the semiconductor device is comprised of an emitter provided by the doped region of the first conductivity, a base provided by the remaining portion of the drain that is of the second conductivity, and a collector provided by the channel portion of the substrate that is of the first conductivity.

In another aspect, a method of manufacturing a semiconductor device is provided, in which the drain side of the semiconductor device includes a bipolar transistor integrated therein. In one embodiment, the method includes forming a gate structure on a first portion of a substrate having a well of a first conductivity. A source region of a second conductivity and a drain region of the second conductivity is then formed within the well of the first conductivity in a portion of a substrate that is adjacent to the first portion of the substrate on which the gate structure is present. A doped region of a second conductivity is formed within the drain region to provide an integrated bipolar transistor on a drain side of the semiconductor device. The integrated bipolar transistor includes a collector, a base and an emitter. The collector is provided by the well of a first conductivity, the base is provided by the drain region of a second conductivity and the emitter is provided by the doped region of a second conductivity that is present in the drain region.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to semiconductor devices, such as field effect transistors, including gate structures to control the output current of the device, wherein in some embodiments a bipolar transistor integrated into a drain side of the semiconductor device generates increased drain current without relying on device scaling or reducing the channel doping. When describing the structures and methods disclosed herein, the following terms have the following meanings, unless otherwise indicated.

As used herein a "field effect transistor (FET)" is a unipolar semiconductor device in which a majority carrier type, i.e., electrons or holes, provides charge flow, and the output current, i.e., source-drain current, is controlled by a gate structure. A field effect transistor has three terminals, i.e., a gate, a source and a drain.

A "gate structure" means a structure used to control output current (i.e., flow of carriers in the channel) of a semiconducting device through electrical or magnetic fields.

As used herein, the term "channel portion" is the region of the substrate underlying the gate structure and between the source region and drain region of the semiconductor device that becomes conductive when the semiconductor device is turned on.

As used herein, the term "drain" means a doped region in a semiconductor device located at the end of the channel, in which carriers are flowing out of the transistor through the drain.

As used herein, the term "source" is a doped region from in the semiconductor device, in which majority carriers are flowing into the channel.

As used herein, the term "conductivity type" denotes a dopant region being p-type or n-type. "Bipolar transistors" are semiconductor devices in which their operation includes electron and holes charge carriers. Current is due to the flow of charge carriers that are injected from a high-concentration emitter into the base, at which they are minority charge carriers that diffuse towards the collector.

The term "direct physical contact" means that the two structures are in contact without any intermediary conducting, insulating or semiconducting structures.

The terms "overlying", "underlying", "atop", and "abutting" define a structural relationship in which two structures are in contact where an intermediary structure of a conducting, insulating, or semiconducting material may or may not be present at the interface of the two structures.

For purposes of the description hereinafter, the terms "upper", "lower", "right", "left", "vertical", "horizontal", "top", "bottom", and derivatives thereof shall relate to the invention, as it is oriented in the drawing figures.

References in the specification to "one embodiment", "an embodiment", "an example", etc., indicate that the embodiment or example described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Figure 1:
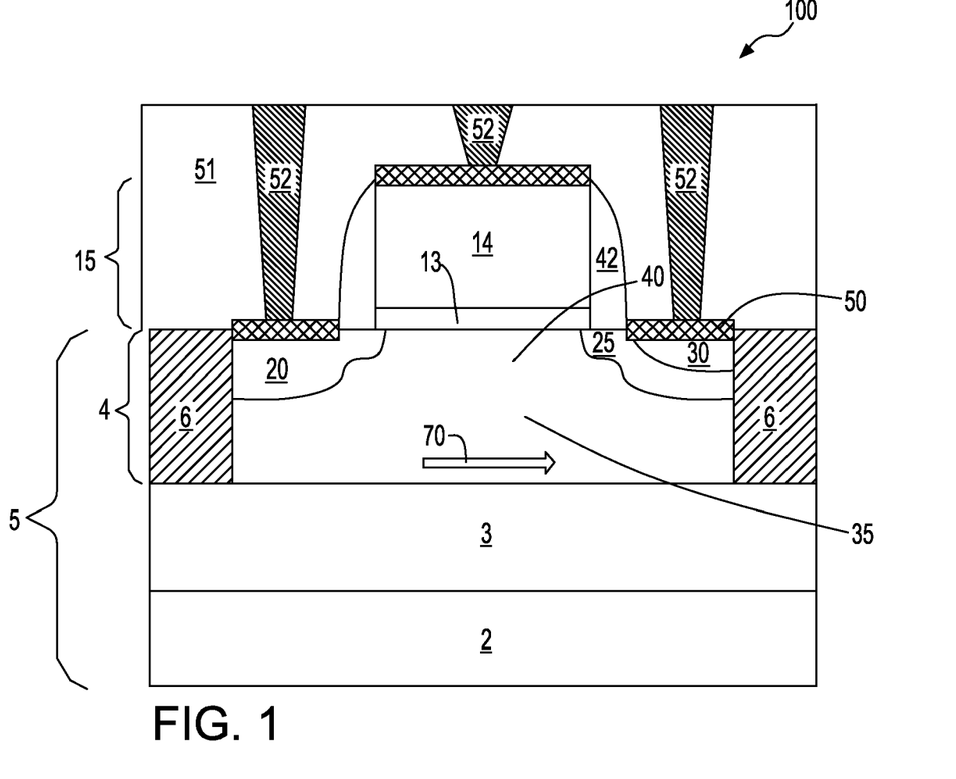
FIG. 1 is a side cross-sectional view depicting a semiconductor device having a bipolar transistor that is integrated into a drain region of the semiconductor device along with the substrate, in accordance with one embodiment of the present invention.

FIG. 1 depicts one embodiment of a semiconductor device 100 in which a gate structure 15 controls the output current (i.e., flow of carriers in the channel) of the semiconducting device 100, and a bipolar transistor is present integrated with a drain region 25 with the upper semiconductor layer 4 of the substrate 5 of the semiconductor device 100. In one embodiment, the semiconductor device 100 is a field effect transistor. Although the following description will refer to the semiconductor device 100 as a field effect transistor, it is noted that any semiconductor device having a gate structure that controls the output current of a device, in which charge carriers are provided by one of electrons or holes, is suitable for use in the present invention. By integrated it is meant that the drain region 25 of the semiconductor device 100 provides the emitter and the base of the bipolar transistor, and the channel portion 40 of the semiconductor device 100 provides the collector of the integrated bipolar transistor. In one example, a doped region 30 of opposite conductivity as the drain region 25 provides the emitter of the integrated bipolar transistor. In one embodiment, the presence of the integrated bipolar transistor facilitates the generation of a high drive current in the field effect transistor that is independent of device scaling or reducing the channel doping.

The gate structure 15 of the field effect transistor is present on a channel portion 40 of the substrate 5. The gate structure 15 typically includes a gate conductor 14 and at least one gate dielectric layer 13. A source region 20 is typically present at a first end of the channel portion 40 of the substrate 5, and a drain region 25 is present at a second end of the channel portion 40 of the substrate 5. In one embodiment, the channel portion 40 of the substrate 5 has a conductivity that is provided by a well implant into the substrate 5, which is performed prior to the formation of the source and drain regions 20, 25. The source and drain regions 20, 25 are typically doped regions having a conductivity that is opposite the well region. Spacers 42 are typically present in contact with the sidewalls of the gate structure 15, in which the spacers 42 are used to facilitate the positioning of the source and drain regions 20, 25 in conjunction with ion implantation.

The channel portion 40 may be referred to as having a first conductivity and the source and drain regions 20, 25 may be referred to as having a second conductivity. In one embodiment, the field effect transistor is an n-type field effect transistor (nFET), in which the first conductivity is p-type and the second conductivity is n-type, wherein the substrate 5 is comprised of a Si-containing material. "P-type" refers to the addition of trivalent impurities to an intrinsic semiconductor that create deficiencies of valence electrons, such as boron, aluminum or gallium to an intrinsic Si-containing substrate. "N-type" refers to the addition of pentavalent impurities that contribute free electrons to an intrinsic semiconductor, such as antimony, arsenic or phosphorous to a Si-containing substrate.

In one example, the channel portion 40 of the substrate 5 is doped with a p-type dopant, i.e., first conductivity, to provide a dopant concentration ranging from $1 \times 10^{15}$ atoms/cm$^3$ to $1 \times 10^{18}$ atoms/cm$^3$. In another example, the channel portion 40 of the substrate 5 is doped with a p-type dopant to provide a dopant concentration ranging from $1 \times 10^{16}$ atoms/cm$^3$ to $1 \times 10^{17}$. As indicated above, the channel portion 40 of the substrate 5 provides the collector of the integrated bipolar transistor.

The source and drain regions 20, 25 have an opposite conductivity as the channel portion 40 of the substrate 5. In one example, in which the semiconductor device 100 is a n-type field effect transistor (nFET), the source and drain regions 20, 25 are doped with an n-type dopant and have a dopant concentration ranging from $1 \times 10^{17}$ atoms/cm$^3$ to $1 \times 10^{20}$ atoms/cm$^3$. In another example, in which the semiconductor device 100 is a p-type field effect transistor (pFET), the source and drain regions 20, 25 are doped with an n-type dopant and have a dopant concentration ranging from $1 \times 10^{18}$ atoms/cm$^3$ to $1 \times 10^{19}$ atoms/cm$^3$.

Still referring to FIG. 1, the drain region 25 of the field effect transistor includes a doped region 30 of a first conductivity that provides the emitter of the integrated bipolar transistor. The doped region 30 of the drain region 25 is of the same conductivity as the channel portion 40 of the substrate 5, and provides the emitter of the integrated bipolar transistor. Typically, the emitter and the collector of the integrated bipolar transistor have the same conductivity. The dopant concentration in the channel portion 40 of the substrate 5 is less than the dopant concentration in the doped region 30 of the drain region 25. In the embodiments of the invention, in which the channel portion 40 has a first conductivity, and the source and drain regions 20, 25 are of a second conductivity, the doped region 30 has a first conductivity. In one embodiment, in which the semiconductor device 100 is an n-type field effect transistor (nFET), the doped region 30 is typically of a p-type conductivity. In another embodiment, in which the semiconductor device 100 is a p-type field effect transistor (pFET), the doped region 30 is typically of a n-type conductivity.

Typically, the doped region 30 of the first conductivity is separated from the channel portion 40 of the substrate 5 by a remaining portion of the drain region 25 that is of the second conductivity. This remaining portion of the drain region 25 that has an opposite conductivity as the channel portion 40 of the substrate 5 and the doped region 30 of the drain region 25 provides the base of the integrated bipolar transistor. In one embodiment, the remaining portion of the drain region 25 may be present between the channel portion 40 of the substrate 5 and the doped region 30, and the remaining portion of the drain region 25 is present at the base of the doped region 30.

In one embodiment, the doped region 30 of the first conductivity is composed of a n-type dopant and has a dopant concentration that ranges from $1 \times 10^{19}$ atoms/cm$^3$ to $1 \times 10^{21}$ atoms/cm$^3$. In another embodiment, the doped region 30 of the first conductivity is composed of a p-type dopant and has a dopant concentration that ranges from $1 \times 10^{19}$ atoms/cm$^3$ to $1 \times 10^{21}$ atoms/cm$^3$.

The field effect transistor depicted in FIG. 1 is formed on a substrate 5 of a semiconductor on insulator (SOI) configuration, but other substrate configurations, such as bulk semiconductor substrates, are within the scope of the present disclosure. In one embodiment, the semiconductor on insulator (SOI) substrate 5 includes an upper semiconductor layer 4, a lower semiconductor layer 2, and a buried insulating layer 3 that is present therebetween. The upper semiconductor layer 4 may include trench isolation regions 6 that are in contact with the buried insulating layer 3. Contact to the terminals, i.e., gate conductor 14, source region 20, and drain region 25, may be provided by interconnects 2 that are present through an interlevel dielectric 51. Silicide contacts 50 may be present between the interconnects 52 and the upper surfaces of the terminals, i.e., gate conductor 14, source region 20, and drain region 25.

Figure 2:
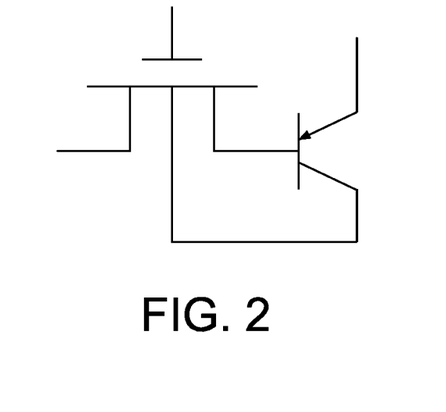
FIG. 2 is a schematic of a circuit diagram of the semiconductor device depicted in FIG. 1, in accordance with one embodiment of the present invention.

FIG. 2 is one embodiment of a circuit diagram of an n-type field effect transistor (nFET) having a bipolar transistor integrated into the drain region 25 of the device, as depicted in FIG. 1. The operation or bias scheme of this device is similar to the operation or bias scheme of a conventional field effect transistor that does not include an integrated bipolar transistor. For example, a positive charge may be applied to the gate structure 15, i.e., gate conductor 14, and a positive charge may be applied to the drain region 25, while the source region 20 is grounded or at a lower bias. However, the bipolar transistor, i.e., PNP bipolar transistor, that is integrated with the field effect transistor through the doped region 30, i.e., p-type doped region 25, that is present in the device's drain region, i.e., n-type drain region, with the upper semiconductor layer 4 of the substrate 5 as a collector produces an increased drain current.

More specifically, referring to FIG. 1, when the n-type field effect transistor is biased to the "on" mode, a positive charge is applied to the drain region 25 and gate structure 15, while the source region 20 is grounded. In response to the bias applied during the "on" mode, the gate structure 15 creates a channel current flow 70 of charge carriers that electrically connects the source region 20, i.e., n-type source region, with the remaining portion of the drain region 25 that is of a second conductivity, i.e., remaining n-type portion of the drain region 25. The doped region 30, i.e., emitter of the integrated bipolar transistor, of a first conductivity, i.e., p-type, that is present in the drain region 25 of the second conductivity injects positively charged holes into the drain 25 and the channel portion 40 of the upper semiconductor layer 4 of the substrate 5, i.e., collector of the integrated bipolar transistor, in which some of the holes injected from the doped region 30 recombine with electrons of the drain current from the operation of the field effect transistor.

The injected holes that are present in the channel portion 40 of the upper semiconductor layer 4 of the substrate 5 raise the device's potential, and lowers the energy barrier between the channel portion 40 of the upper semiconductor layer 4 of the substrate 5 and the source region 20. As the energy barrier between the source region 20 and the channel portion 40 of the upper semiconductor layer 4 of the substrate 5 decreases, more electrons will flow through channel portion 40 of the upper semiconductor layer 4 of the substrate 5 into the remaining portion of drain region 25 that is of the second conductivity, i.e., n-type. Because, the remaining portion of drain region 25 that is of the second conductivity, i.e., n-type, is the base of the integrated bipolar transistor, and the doped region 30 of the first conductivity, i.e., p-type, that is present in the drain region 25 is an emitter of the integrated bipolar transistor, holes are injected into the base to match the electrons that are flowing into the base from the channel, and residual holes are injected into the upper semiconductor layer 4 of the substrate 5. The result is that the doped region 30 of the first conductivity, i.e., p-type, injects increased current into the channel portion 40 of the upper semiconductor layer 4 of the substrate 5. In one embodiment, this positive loop is continued to increase the channel current for the MOSFET.

Unlike conventional field effect transistors, which do not include an integrated bipolar transistor at the drain side of the field effect transistor, the present device can achieve higher drain current without scaling-down of the device, or lowering the threshold of device through decreasing the channel doping. Although the above description of device operation is directed to n-type field effect transistors, the semiconductor device 100 may also be a p-type field effect transistor. In a p-type field effect transistor the majority carriers are holes, as opposed to electrons in n-type field effect transistors, and the minority carriers are electrons, as opposed to holes in n-type field effect transistors. In this embodiment, the channel portion 40 of the substrate 5 and the doped region 30 of the drain region 25 are doped to an n-type conductivity, i.e., first conductivity, and the source and drain regions 20, 25 are doped to a p-type conductivity, i.e., second conductivity. In one embodiment, the dopant concentration of the source and the drain region 20, 25 ranges from $10^{17}$ atoms/cm$^3$ to $10^{20}$ atoms/cm$^3$. In one embodiment, the dopant concentration of the channel portion 40 of the substrate 5 ranges from $10^{15}$ atoms/cm$^3$ to $10^{18}$ atoms/cm$^3$. In one embodiment, the dopant concentration in the doped region 30 of the drain region 25 that provides the emitter of the integral bipolar transistor ranges from $10^{19}$ atoms/cm$^3$ to $10^{21}$ atoms/cm$^3$.

FIGS. 1 and 3-5 illustrate some of the basic processing steps that may be employed in one embodiment of a method of manufacturing a semiconductor device 100, in which the drain side of the semiconductor device 100 includes a bipolar transistor integrated therein. In one embodiment, the method includes forming a gate structure 15 on a first portion of the substrate 5 having a well 35 of a first conductivity.

Figure 3:
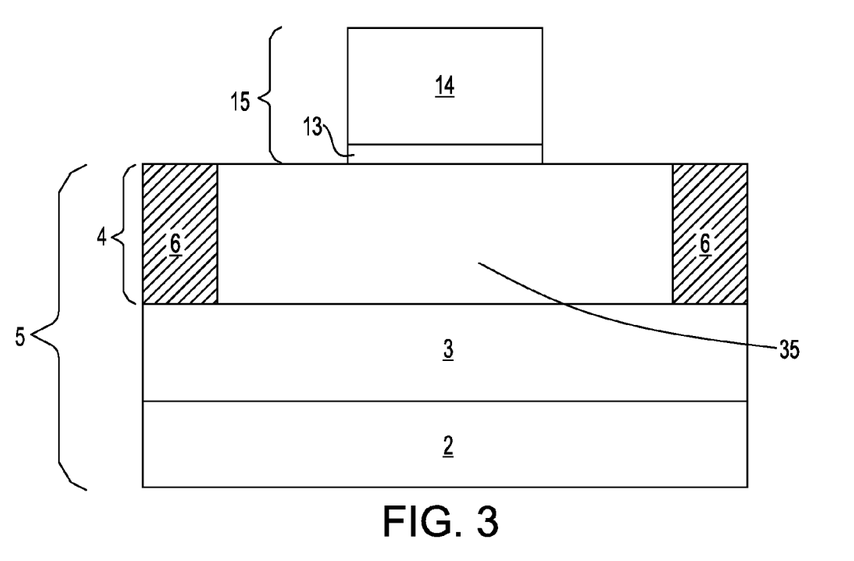
FIG. 3 is a side cross-sectional view of one embodiment of initial process steps for producing a semiconductor device having a bipolar transistor that is integrated into the device's drain region, which include forming a gate structure overlying a well region of a first conductivity in a substrate, in accordance with the present invention.

FIG. 3 depicts one embodiment of forming a gate structure 15 on a substrate 5. The substrate 5 may include, but is not limited to, silicon containing materials, GaAs, InAs and other like semiconductors. Silicon containing materials as used to provide the substrate 5 include, but are not limited to, Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment in which the substrate 5 is a silicon-on-insulator (SOI) or SiGe-on-insulator (SGOI) substrate, the upper semiconductor layer 4 (also referred to as SOI layer) that is atop the buried insulating layer 3 can have a thickness greater than 10 nm. The buried insulating layer 3 may be composed of an oxide, such as silicon oxide, and may have a thickness ranging from 10 nm to 100 nm. The thickness of the lower semiconductor layer 2 that is underlying the buried insulating layer 3 may range from 10 nm to 500 nm. The SOI or SGOI substrate may be fabricated using a thermal bonding process, or may be fabricated by an ion implantation process.

The substrate 5 may further include trench isolation regions 6. The trench isolation regions 6 can be formed by etching a trench in the silicon containing layer 4 utilizing a dry etching process, such as reactive-ion etching (RIE) or plasma etching. The trenches may optionally be lined with a liner material, e.g., an oxide, and then CVD or another like deposition process is used to fill the trench with oxide grown from tetraethylorthosilicate (TEOS) precursors, high-density oxide or another like trench dielectric material. After trench dielectric fill, the structure may be subjected to a planarization process.

In one embodiment, the substrate 5 includes a well region 35. The well region 35 is a p-type or n-type conductivity region that may be ion implanted into the semiconductor material of the substrate 5, or may be in-situ doped during the growth of the semiconductor material of the substrate 5. In one example, the in-situ doping is conducted during an epitaxial growth process of the semiconductor material of the substrate 5. In one embodiment, in which the semiconductor device 100 formed on the substrate 5 is an n-type field effect transistor (nFET), the well region 35 is doped with a p-type dopant. In another embodiment, in which the semiconductor device 100 formed on the substrate is a p-type field effect transistor (pFET), the well region 35 is doped with an n-type dopant. In the embodiments in which the well region 35 is formed by ion implantation, the dopant of the well region 35 may be introduced using an implant energy ranging from 10 keV to 150 keV, and the implant dose may range from $5 \times 10^{13}$ atoms/cm$^2$ to $1 \times 10^{15}$ atoms/cm$^2$. The conductivity of the well region 35 typically dictates the conductivity of the channel portion 40 of the substrate 5.

Still referring to FIG. 3, the gate structure 15 may be formed atop the substrate 5 utilizing deposition, lithography and etching processes. Alternatively, a replacement gate process can be used to form gate structure 15. More specifically, in one embodiment, a gate structure 15 may be provided atop the substrate 5 by blanket depositing the layers of a gate stack, and then patterning and etching the gate stack to provide the gate structure 15. For example, forming the gate stack may include blanket deposition of material layers including the gate dielectric layer 13 and a gate conductor 14 present on the gate dielectric layer 13.

The gate stack may be patterned using photolithography and etching to produce the gate structure 15. In one example, following the deposition of the gate dielectric layer 13, and the gate conductor 14, an etch mask may be formed atop the uppermost layer of the gate stack. The etch mask typically protects the portion of the layered stack that provides the gate structure 15, wherein the portions exposed by the etch mask are removed by an anisotropic etch process, such as a reactive ion etch. Reactive ion etch (RIE) is a form of plasma etching, in which the surface to be etched is placed on the RF powered electrode and takes on a potential that accelerates an etching species, which is extracted from a plasma, towards the surface to be etched, wherein a chemical etching reaction takes place in the direction normal to the surface being etched. In one embodiment, the etch mask may be provided by a patterned photoresist layer.

The gate dielectric layer 13 of the gate structure 15 may be composed of an oxide material. Suitable examples of oxides that can be employed as the gate dielectric layer 13 include, but are not limited to: $SiO_2$, $Al_2O_3$, $ZrO_2$, $HfO_2$, $Ta_2O_3$, perovskite-type oxides and combinations and multi-layers thereof. The gate dielectric layer 13 may be composed of a high k dielectric having a dielectric constant of greater than about 4.0, and in some embodiments greater than 7.0. The high k dielectric may include, but is not limited to, an oxide, nitride, oxynitride and/or silicate including metal silicates and nitrided metal silicates. In one embodiment, the high-k dielectric is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high k dielectrics suitable for use as the gate dielectric layer 13 in the present method include hafnium silicate and hafnium silicon oxynitride.

The gate dielectric layer 13 can be formed by a thermal growth process such as, for example, oxidation, nitridation or oxynitridation. The gate dielectric layer 13 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The gate dielectric layer 13 may also be formed utilizing any combination of the above processes. The gate dielectric layer 13 typically has a thickness ranging from 1 nm to 10 nm. In one example, the gate dielectric layer 13 has a thickness ranging from 2 nm to 5 nm. In one embodiment, the gate dielectric layer 13 is in direct physical contact with a surface, e.g., upper surface, of the substrate 5.

The gate conductor 14 may be composed of single crystal Si, SiGe, SiGeC or combinations thereof. In another embodiment, the gate conductor 14 may further comprise a metal and/or silicide. In other embodiments, the gate conductor 14 is comprised of multi-layered combinations of the aforementioned conductive materials. In one example, the gate conductor 14 is composed of a single layer of polysilicon. The gate conductor 14 may be formed by chemical vapor deposition (CVD) or physical vapor deposition (PVD). In one embodiment, the gate conductor 14 may be doped to a p-type conductivity. For example, the gate conductor 14 may be doped with an element from group IIIA of the periodic table of elements, such as boron, with an ion implantation dose ranging from 1E15 cm$^{-2}$ to about 5E16 cm$^2$.

Variations of CVD processes suitable for forming the gate conductor 14 include, but are not limited to, Atmospheric Pressure CVD (APCVD), Low Pressure CVD (LPCVD) and Plasma Enhanced CVD (EPCVD), Metal-Organic CVD (MOCVD) and combinations thereof. The gate conductor 14 typically has a thickness ranging from 1 nm to 20 nm. In one example, the gate conductor 14 has a thickness ranging from 5 nm to 10 nm.

Figure 4:
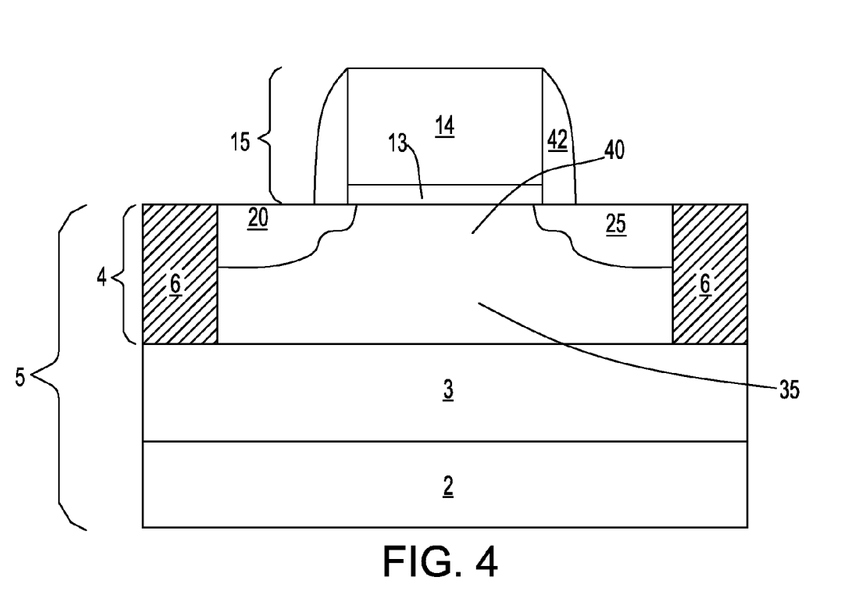
FIG. 4 is a side cross-sectional view depicting implanting dopants into the substrate to provide source and drain regions of a second conductivity, in accordance with one embodiment of the present invention.

FIG. 4 depicts implanting dopants into the substrate 5 to provide source and drain regions 20, 25. A source region 20 of a second conductivity and a drain region 25 of a second conductivity are formed within the well 35 of a first conductivity in a portion of the substrate 5 that is adjacent to the first portion of the substrate 5 on which the gate structure 15 is present.

Source and drain extension regions may be formed using an ion implantation process. More specifically, in one example, when forming source and drain extension regions the dopant species may be boron or $BF_2$. Boron may be implanted utilizing implant energies ranging 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and having an implant dose ranging from $5 \times 10^{14}$ atoms/cm$^2$ to $5 \times 10^{15}$ atoms/cm$^2$.

Still referring to FIG. 4, a spacer 42 may be formed in direct physical contact with the sidewalls of the gate structure 15. The spacer 42 may be composed of oxide, i.e., $SiO_2$, but may also comprise nitride or oxynitride materials. Each spacer 42 may have a width ranging from 50.0 nm to 100.0 nm. The spacer 42 can be formed by deposition and etch processes. For example, a conformal dielectric layer may be deposited using deposition processes, including, but not limited to, chemical vapor deposition (CVD), plasma-assisted CVD, and low-pressure chemical vapor deposition (LPCVD). Following deposition, the conformal dielectric layer is then etched to define the geometry of the spacer 42 using an anisotropic plasma etch procedure such as, reactive ion etch.

Source and drain regions 20, 25, i.e., deep source and drain regions, may be implanted into the substrate 5. Typically, the source and drain regions 20, 25 are doped to provide a second conductivity, and the channel portion 40 of the substrate has a first conductivity. The source and drain regions 20, 25 typically have the same conductivity as the corresponding source and drain extension regions. Typical implant species for source and drain regions 20, 25 having a p-type conductivity may include boron or $BF_2$. The source and drain regions 20, 25 can be implanted with boron utilizing an energy ranging from 1.0 keV to 8.0 keV with a dose ranging from $1\times10^{15}$ atoms/cm$^2$ to $7\times10^{15}$ atoms/cm$^2$. The source and drain regions 20, 25 may also be implanted with $BF_2$ with an implant energy ranging from 5.0 keV to 40.0 keV and a dose ranging from $1\times10^{15}$ atoms/cm$^2$ to $7\times10^{15}$ atoms/cm2. Source and drain regions 20, 25 having an n-type conductivity may be implanted with phosphorus using an energy of about 3 keV to 15 keV with a dose of about $1\times10^{15}$ atoms/cm$^2$ to about $7\times10^{15}$ atoms/cm$^2$. The source and drain regions 20, 25 may be formed by counterdoping the well region 35 of the substrate 5, in which the counterdoped regions provide the source and drain region 20, 25 and the remaining portion of the well region 35 that is between the source and the drain region 20, 25 provides the channel portion 40 of the substrate. In one embodiment, in which the semiconductor device 100 is processed to provide an n-type field effect transistor 100, the channel portion 40 of the substrate is doped with a p-type dopant and the source and drain regions 20, 25 are doped with an n-type dopant.

Figure 5:
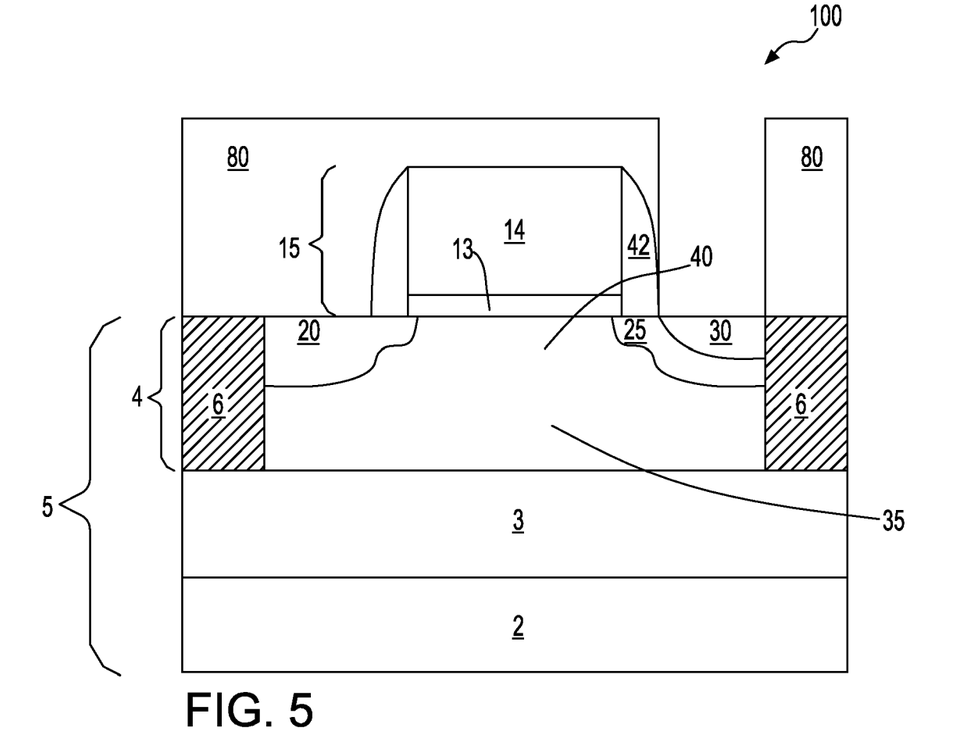
FIG. 5 is a side cross-sectional view depicting one embodiment of forming a doped region of a second conductivity within the drain region to provide an integrated bipolar transistor on a drain side of the semiconductor device, in accordance with the present invention.

FIG. 5 depicts forming a doped region 30 of a first conductivity within the drain region 25 to provide an integrated bipolar transistor on the drain side of the semiconductor device 100. The doped region 30 of the first conductivity is formed within the drain region 25, but is not formed in the source region 20, therefore providing an asymmetric source and drain configuration. In one embodiment, the doped region 30 is provided by ion implantation. To selectively implant the doped region 30 of a first conductivity in the drain region 25 of a second conductivity, and implant mask 80 may be utilized in conjunction with the ion implantation process. The implant mask 80 may be composed of a photoresist material. In another embodiment, the implant mask 80 may be provided by a hard mask composed of a dielectric layer. In one embodiment, the implant mask 80 exposes the portion of the drain region 25 in which the doped region 30 is to be formed and is present overlying and protecting the remaining portions of the device and substrate 5.

The implant mask 80 may be provided by a blanket layer of photoresist material that is deposited overlying at least the gate structure 15, the source region 20 and the drain region 25 utilizing a deposition process such as, for example, CVD, PECVD, evaporation or spin-on coating. The blanket layer of photoresist material is patterned into the implant mask 80 by utilizing a lithographic process that may include exposing the photoresist material to a pattern of radiation and developing the exposed photoresist material utilizing a resist developer to provide an opening exposing the portion of the drain region 25 in which the doped region of the first conductivity is to be implanted.

Still referring to FIG. 5, following the formation of the implant mask 80, an ion implantation is conducted to introduce dopants to the exposed portion of the drain region 25. The dopant implanted to provide the doped region 30 of the drain region 25 is typically of an opposite conductivity as the drain region 25. The doped region 30 typically has the same conductivity as the channel portion 40 of the substrate 5. The doped region 30 of the first conductivity provides the emitter region of the integrated bipolar transistor, and the remaining portion of the drain region 25 having a second conductivity provides the base region of the integrated bipolar transistor.

Typical implant species for the doped region 30 having a p-type conductivity may include boron or $BF_2$. The doped region 30 can be implanted with boron utilizing an energy ranging from 1.0 keV to 8.0 keV with a dose ranging from $1\times10^{15}$ atoms/cm$^2$ to $7\times10^{15}$ atoms/cm$^2$. The doped region 30 may also be implanted with $BF_2$ with an implant energy ranging from 5.0 keV to 40.0 keV and a dose ranging from $1\times10^{15}$ atoms/cm$^2$ to $7\times10^{15}$ atoms/cm2. A doped region 30 having an n-type conductivity may be implanted with phosphorus using an energy of about 3 keV to 15 keV with a dose of about $1\times10^{15}$ atoms/cm$^2$ to about $7\times10^{15}$ atoms/cm$^2$.

In one embodiment, in which the semiconductor device 100 is processed to provide an n-type field effect transistor 100, the doped region 30 is doped with a p-type dopant, the substrate is doped with a p-type dopant and the source and drain regions 20, 25 are doped with an n-type dopant. In the embodiment, in which the semiconductor device 100 is processed to provide an p-type field effect transistor 100, the doped region 30 is doped with a n-type dopant, the substrate is doped with a n-type dopant and the source and drain regions 20, 25 are doped with an p-type dopant. Following formation of the doped region 30 of the first conductivity, the implant mask 80 is removed using oxygen ashing.

In one embodiment, the anneal process step may be conducted following the completion of all of the implant processing steps to reduce the thermal budget of the manufacturing process. Following the source and drain implantation, the structure may be annealed to promote diffusion of the dopant species. The source and drain regions may be activated by an annealing process, such as rapid thermal anneal. In one example, the rapid thermal annealing temperature is carried out using a temperature ranging from 750° C. to 1200° C. for a time period ranging from 1.0 second to 20.0 seconds. The anneal process may be conducted following the completion of all of the implant processing steps to reduce the thermal budget of the manufacturing process.

Silicide contacts 50 may be formed to the gate structure 15 and the source and drain regions 20, 25. Silicide formation typically requires depositing a refractory metal, such as Ni, Co, or Ti, onto the surface of a Si-containing material. Following deposition, the structure is then subjected to an annealing step using thermal processes, such as rapid thermal annealing. During thermal annealing, the deposited metal reacts with Si forming a metal semiconductor alloy, e.g., silicide.

An interlevel dielectric 52 may be deposited atop the conformal dielectric material 51. The interlevel dielectric 52 may be selected from the group consisting of silicon containing materials such as $SiO_2$, $Si_3N_4$, $SiO_xN_y$, SiC, SiCO, SiCOH, and SiCH compounds; the above-mentioned silicon containing materials with some or all of the Si replaced by Ge;

carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric 52 include: any of the aforementioned materials in porous form, or in a form that changes during processing to or from being porous and/or permeable to being non-porous and/or non-permeable.

The interlevel dielectric layer 52 may be formed by various deposition, including, but not limited to, spinning from solution, spraying from solution, chemical vapor deposition (CVD), plasma enhanced CVD (PECVD), sputter deposition, reactive sputter deposition, ion-beam deposition, and evaporation. The conformal layer of a dielectric material 51 and the interlevel dielectric layer 52 are then patterned and etched to form via holes to the various source and drain and gate conductor regions of the substrate 5. Following via formation, interconnects 53 are formed by depositing a conductive metal into the via holes using deposition processing, such as CVD or plating. The conductive metal may include, but is not limited to, tungsten, copper, aluminum, silver, gold, and alloys thereof. The resultant structure is depicted in FIG. 1.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor device comprising:
   a gate structure present atop a channel portion of a semiconductor on insulator (SOI) layer of a semiconductor on insulator (SOI) substrate having a first conductivity;
   a source region of a second conductivity present at a first end of the channel portion; and
   a drain region of the second conductivity present at a second end of the channel portion and including a doped region of the first conductivity, in which the doped region of the first conductivity is separated from the channel region by a remaining portion of the drain region that is of the second conductivity, wherein a bipolar transistor region is present integrated with the drain region of the semiconductor device, in which the bipolar transistor region is comprised of an emitter provided by the doped region of the first conductivity, a base provided by the remaining portion of the drain that is of the second conductivity, and a collector provided by the channel of the first conductivity, wherein the collector is electrically isolated by a buried dielectric layer of the SOI substrate and a trench isolation region extending from an upper surface of the SOI layer to the buried dielectric layer at a perimeter of the source region and the drain region.

2. The semiconductor device of claim 1, wherein the first conductivity is p-type and the second conductivity is n-type, and the semiconductor device is an n-type semiconductor device, wherein the SOI substrate is comprised of a Si-containing material.

3. The semiconductor device of claim 1, wherein the first conductivity is n-type and the second conductivity is p-type, and the semiconductor device is a p-type semiconductor device, wherein the SOI substrate is comprised of a Si-containing material.

4. The semiconductor device of claim 2, wherein a dopant that provides the first conductivity is selected from the group consisting of boron, aluminum, gallium, and combinations thereof, and the dopant that provides the second conductivity is selected from the group consisting of antimony, arsenic, phosphorous and combinations thereof.

5. The semiconductor device of claim 2, wherein a dopant concentration in the channel portion that provides the first conductivity is less than a dopant concentration in the doped region of the first conductivity in the drain region.

6. The semiconductor device of claim 2, wherein a dopant concentration in the source region of the second conductivity ranges from $1 \times 10^{17}$ atoms/cm$^3$ to $1 \times 10^{20}$ atoms/cm$^3$.

7. The semiconductor device of claim 6, wherein a dopant concentration in the channel region that provides the first conductivity ranges from $1 \times 10^{15}$ atoms/cm$^3$ to $1 \times 10^{18}$ atoms/cm$^3$.

8. The semiconductor device of claim 7, wherein a dopant concentration in the doped region of the first conductivity ranges from $1 \times 10^{19}$ atoms/cm$^3$ to $1 \times 10^{21}$ atoms/cm$^3$.

9. The semiconductor device of claim 3, wherein a dopant concentration in the source region of the second conductivity ranges from $10^{17}$ atoms/cm$^3$ to $10^{20}$ atoms/cm$^3$.

10. The semiconductor device of claim 9, wherein a dopant concentration in the channel portion that provides the first conductivity ranges from $10^{15}$ atoms/cm$^3$ to $10^{18}$ atoms/cm$^3$.

11. The semiconductor device of claim 10, wherein a dopant concentration in the doped region of the first conductivity in the drain region ranges from $10^{17}$ atoms/cm$^3$ to $10^{20}$ atoms/cm$^3$.

12. A method of forming a semiconductor device comprising:
   forming a gate structure on a first portion of a semiconductor on insulator (SOI) substrate having a well of a first conductivity;
   forming a source region of a second conductivity and a drain region of the second conductivity within the well of the first conductivity in a portion of the SOI substrate that is adjacent to the first portion of the SOI substrate on which the gate structure is present; and
   forming a doped region of a second conductivity within the drain region to provide an integrated bipolar transistor on a drain side of the semiconductor device, in which the integrated bipolar transistor is comprised of collector provided by the well of the first conductivity, a base provided by the drain region of the second conductivity, and an emitter provided by the doped region of the second conductivity that is present in the drain region, wherein the collector is electrically isolated by a buried dielectric layer of the SOI substrate and a trench isolation region extending from an upper surface of the semiconductor on insulator (SOI) layer to the buried dielectric layer of the SOI substrate at a perimeter of the source region and the drain region.

13. The method of claim 12, wherein the first conductivity is p-type and the second conductivity is n-type, and the semiconductor device is an n-type semiconductor device.

14. The method of claim 12, wherein the first conductivity is n-type and the second conductivity is p-type.

15. The method of claim 13, wherein the substrate is comprised of a Si-containing material, and forming the well region of the first conductivity comprises at least one of ion implantation of a dopant selected from the group consisting of boron, aluminum, gallium, and combinations thereof, and epitaxially growing a silicon-containing layer being in-situ doped with a dopant selected from the group consisting of boron, aluminum, gallium and combinations thereof.

16. The method of claim 15, wherein the forming of the source region of the second conductivity and the drain region of the second conductivity comprises ion implantation of a dopant selected from the group consisting of antimony, arsenic, phosphorous and combinations thereof into the portion of the SOI substrate that is adjacent to the first portion of the SOI substrate on which the gate structure is present.

17. The method of claim 16, wherein the forming of the doped region of the second conductivity within the drain region comprises ion implantation of a dopant selected from the group consisting of boron, aluminum, gallium, and combinations thereof, to provide a doped region having a greater dopant concentration than the well region of the first conductivity.

18. The method of claim 14, wherein the SOI substrate is comprised of a Si-containing material, and forming the well region of the first conductivity comprises at least one of ion implantation of a dopant selected from the group consisting of antimony, arsenic, phosphorous and combinations thereof, and epitaxially growing a silicon-containing layer being in-situ doped with a dopant selected from the group consisting of antimony, arsenic, phosphorous and combinations thereof.

19. The method of claim 18, wherein the forming of the source region of the second conductivity and the drain region of the second conductivity comprises ion implantation of a dopant selected from the group consisting of boron, aluminum, gallium, and combinations thereof into the portion of the SOI substrate that is adjacent to the first portion of the SOI substrate on which the gate structure is present.

20. The method of claim 19, wherein the forming of the doped region of the second conductivity within the drain region comprises ion implantation of a dopant selected from the group consisting of antimony, arsenic, phosphorous and combinations thereof, to provide a doped region having a greater dopant concentration than the well region of the first conductivity.

* * * * *